(12) United States Patent
Aikoh et al.

(10) Patent No.: US 7,158,469 B2
(45) Date of Patent: Jan. 2, 2007

(54) OPTICAL HEAD WITH LIGHT-RECEIVING DEVICE

(75) Inventors: Hideki Aikoh, Higashiosaka (JP); Tohru Nakamura, Katano (JP); Hideki Nakata, Soraku-gun (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 232 days.

(21) Appl. No.: 10/502,662

(22) PCT Filed: May 6, 2003

(86) PCT No.: PCT/JP03/05668

§ 371 (c)(1),
(2), (4) Date: Jul. 26, 2004

(87) PCT Pub. No.: WO03/098616

PCT Pub. Date: Nov. 27, 2003

(65) Prior Publication Data
US 2005/0169128 A1    Aug. 4, 2005

(30) Foreign Application Priority Data
May 15, 2002    (JP) .............................. 2002-139611

(51) Int. Cl.
G11B 7/00    (2006.01)
(52) U.S. Cl. ..................................... 369/120
(58) Field of Classification Search ..................... None
See application file for complete search history.

(56) References Cited

U.S. PATENT DOCUMENTS

| 4,972,400 | A | * | 11/1990 | Kuwabara et al. | ....... 369/44.29 |
| 5,557,116 | A | * | 9/1996 | Masui et al. | ................. 257/100 |
| 5,600,131 | A | * | 2/1997 | Miura | ...................... 250/214.1 |
| 6,038,203 | A | * | 3/2000 | Tajiri et al. | ............... 369/112.1 |
| 6,501,715 | B1 | * | 12/2002 | Mori et al. | ............... 369/44.29 |

FOREIGN PATENT DOCUMENTS

| JP | 9-63087 | 3/1997 |
| JP | 11-283267 | 10/1999 |
| JP | 2000-12773 | 1/2000 |

OTHER PUBLICATIONS

Hamamatsu Photonics K.K., Product Specification "Si PIN Photo Diode S8283".

* cited by examiner

*Primary Examiner*—Paul Huber
(74) *Attorney, Agent, or Firm*—Hamre, Schumann, Mueller & Larson, P.C.

(57) ABSTRACT

The present invention realizes a compact and thin light-receiving device in a simple configuration, and provides a compact optical head on which this light-receiving device is mounted. The light-receiving device for receiving light reflected from an information recording medium includes a light-receiving chip having a plurality of electrodes and a flexible wiring board on which the light-receiving chip is mounted and fixed. The plurality of electrodes are connected electrically to the flexible wiring board by attaching directly or via a metal wire.

19 Claims, 10 Drawing Sheets

OPTICAL HEAD WITH LIGHT-RECEIVING DEVICE

This application is a 371 of PCT/JP03/05668, filed May 6, 2003.

1. Technical Field

The present invention relates to an optical head for optically recording/reproducing information with respect to an optical disk that is an information recording medium.

2. Background Art

In the background of vigorous technical development of high density and large capacity memories, a rewriting function, in addition to high density, large capacity and high reliability, is an ability required for memories. Optical disks satisfy these requirements, and there is a demand for compact and simplified optical heads for optically recording/reproducing information with respect to optical disks.

FIG. 7 is a schematic view showing a configuration of a general optical head. In FIG. 7, reference numeral 20 denotes an optical disk that is an information recording medium. Reference numeral 21 denotes a semiconductor laser that is a light source. Reference numeral 22 denotes an objective lens that is focusing means for focusing light emitted from the semiconductor laser 21 on the optical disk 20 as a small light spot. Reference numeral 23 denotes an objective lens actuator that is focusing device driving means for allowing the objective lens 22 to follow the side-runout or the decentering of the optical disk 20. Reference numeral 24 denotes a half mirror for splitting light reflected from the optical disk 20. Reference numeral 25 denotes a light-receiving device for receiving the light reflected from the optical disk 20. The optical head 26 is composed of the semiconductor laser 21, the objective lens 22, the objective lens actuator 23, the half mirror 24 and the light-receiving device 25. Thus, the light-receiving device 25 is a RF signal light-receiving device for detecting information signals of the optical disk 20, and also serves as a servo signal light-receiving device for detecting servo signals thereof.

In the conventional commercial optical heads, a light-receiving device divided into multiple portions for detecting RF signals and detecting servo signals is used. FIGS. 8A and 8B show a simplified example of a conventional light-receiving device that is commonly used. FIGS. 8A and 8B are a plan view and a cross-section view of a conventional halved photodiode that is a light-receiving device, respectively. Hereinafter, the configuration and the function of this halved photodiode will be described. Reference numeral 30 denotes a halved photodiode that is a light-receiving device. Reference numerals 31a and 31b denote light-receiving chips that are semiconductors (whose structure is not described in detail) and have an area of 0.75 mm×0.75 mm and a thickness of 0.3 mm. Reference numeral 38 denotes a divisional line that divides the light-receiving chips 31a and 31b. Reference numerals 32a and 32b denote front face electrodes provided on the light-receiving chips 31a and 31b, respectively. Reference numerals 33a, 33b, 33c and 33d denote frame terminals. Reference numeral 34 denotes a frame in which the frame terminals 33c and 33d form an integral structure. Reference numeral 35 denotes a back face electrode that is provided commonly to the light-receiving chips 31a and 31b. Reference numeral 36a denotes a metal wire for electrically connecting the electrode 32a and the frame terminal 33a. Reference numeral 36b denotes a metal wire for electrically connecting the electrode 32b and the frame terminal 33b. Reference numeral 37 denotes a resin for forming the halved photodiode 30 as a light-receiving device in the shape of an area of 4 mm×5 mm, excluding the frame terminals, and a height of 1.8 mm.

The back face electrode 35 of the light-receiving chips 31a and 31b is connected electrically to the frame 34. The front face electrodes 32a and 32b are connected electrically to the frame terminals 33a and 33b by the metal wires 36a and 36b. Therefore, the halved photodiode 30, which is a light-receiving device, has the frame terminals 33a and 33b as anode terminals, the frame terminals 33c and 33d as cathode terminals and serves as a halved photodiode while the light received by the light-receiving chips 31a and 31b is output from the frame terminals 33a and 33b, respectively, in the form of a photoelectric current. For each size, substantial values are shown. The halved photodiode 30 that is a light-receiving device is a photodiode, so that the light-receiving chips 31a and 31b also can be referred to as "light-receiving cells".

The halved photodiode 30 shown in FIGS. 8A and 8B, which is a conventional light-receiving device, has the following problems.

First, even if the light-receiving chips are small and thin, the light-receiving device can be large and thick. In other words, although the light-receiving chips 31a and 31b are small and thin, having an area of 0.75 mm×0.75 mm and a thickness of 0.3 mm, the halved photodiode 30 that is a light-receiving device is formed with a resin 37 having an area of 4 mm×5 mm, excluding the frame terminals, and a height of 1.8 mm.

Secondly, the flexible wiring board on which the halved photodiode 30 is mounted also can be large. This will be described with reference to FIGS. 9A and 9B. FIGS. 9A and 9B are a plan view and a cross-sectional view showing the configuration in which the halved photodiode 30 shown in FIGS. 8A and 8B, which is a light-receiving device, is connected electrically to a flexible wiring board 48. In the halved photodiode 30, the frame terminals 33a, 33b, 33c, and 33d are connected electrically to conduction lines 39 on the flexible wiring board 48 by soldering or the like. A component 40 is a reinforcing plate that is adhered to the flexible wiring board 48 so as to form an integral unit and is constituted by epoxy material containing glass. The flexible wiring board 48 has an opening 47 larger than the 4 mm×5 mm outline of the resin 37 of the halved photodiode 30 in order to negate a step with the frame terminals of the halved photodiode 30. Therefore, so-called "routing" of the conduction lines 39 cannot be performed without bypassing the outside of the resin 37 of the halved photodiode 30. Consequently, it cannot be avoided that the area of the periphery of a mounting portion for the halved photodiode 30 of the flexible wiring board 48 becomes large. In the case of the configuration shown in FIGS. 9A and 9B, if the outline of the resin 37 is fit into the opening 47 with a margin of 0.3 mm, the size of the opening 47 is 4.6 mm×5.6 mm. Furthermore, since the conduction lines 39 of the frame terminals 33c and 33d bypass the outside of the resin 37, the size of the flexible wiring board 48 is 7.8 mm when it is assumed that the line width is 0.1 mm and the space width is 0.5 mm.

Because of the first and the second problems as described above, the optical head on which the halved photodiode 30 is mounted, which is a light-receiving device, has a problem in that the shape of the halved photodiode 30 is a factor of determining the size limit of the optical head. This will be described with reference to FIG. 10A. FIG. 10A is a side view of the optical head, and schematically shows the positional relationship of the optical disk 20, the semiconductor laser 21, which is a light source, and the light-receiving device for detecting RF signals and detecting servo signals.

As can be seen from FIG. 10A, assuming that the components are spaced away from the optical disk 20 by 1 mm, since the diameter of the semiconductor laser 21, which is a light source, is generally 5.6 mm, the light source portion can be arranged 6.6 mm from the optical disk 20. On the other hand, in the case where the halved photodiode 30 shown in FIGS. 8A and 8B, which is a light-receiving device, is mounted and fixed to the flexible wiring board 48, as shown in FIGS. 9A and 9B, the size of the flexible wiring board 48 of the detecting portion is 7.8 mm, as described above. The light-receiving device 30 is adjusted to be positioned in a plane perpendicular to the optical axis so that the optical head 26 can exhibit its performance, and it is assumed that the moving range thereof is ±0.5 mm. That is, the detecting portion requires a space of 1 mm, a moving amount of 0.5 mm, a width of the flexible wiring board 48 of 7.8 mm, and a moving amount of 0.5 mm, which makes 9.8 mm from the optical disk 20. Thus, the detecting portion on which the light-receiving device 30 for detecting RF signals and detecting servo signals, which is essential to the optical head, is mounted, is projected from the light source portion by as much as 3.2 mm, which determines the size limit at least in the height direction of the optical head.

Next, the case of a sensor for detecting, for example, a tilt of a information recording medium, instead of the light-receiving device for detecting RF signals and detecting servo signals, which is essential to the optical head, will be considered. Referring to FIG. 10B, the sensor is provided in parallel to the optical disk 20, for example, in a space above the semiconductor laser 21, so as to detect a tilt of the optical disk 20. This sensor is the halved photodiode 30 that is the light-receiving device shown in FIGS. 8A and 8B, and has a thickness of 1.8 mm when it is mounted and fixed on the flexible wiring board 48 as shown in FIGS. 9A and 9B. That is, the light source portion requires a space of 1 mm, a thickness of the sensor (halved photodiode 30, which is a light-receiving device) of 1.8 mm, and a size of the semiconductor laser of 5.6 mm, which makes 8.4 mm from the optical disk 20. The sensor herein is not a light-receiving device for detecting RF signals and detecting servo signals, which is essential to the optical head, and therefore the enlarged size of 1.8 mm causes a large problem, especially in an attempt to achieve compact optical heads.

DISCLOSURE OF INVENTION

The present invention is carried out in light of the above problem, and it is an object of the present invention is to provide a compact and thin light-receiving device having a simple configuration, and to provide a compact and thin optical head on which the light-receiving device is mounted.

In order to achieve the above object, a first optical head of the present invention includes a light source, means for driving a focusing element, and a light-receiving device for receiving light reflected from an information recording medium, wherein the light-receiving device comprises a light-receiving chip having a plurality of electrodes, and a flexible wiring board on which the light-receiving chip is mounted and fixed, and the plurality of electrodes are connected electrically to the flexible wiring board by attaching directly or via a metal wire.

With this configuration, firstly, a light-receiving device that is more compact and thinner than conventional light-receiving devices can be realized in a simple configuration without increasing the number of the components. Secondly, the size of the flexible wiring board in which the light-receiving device is configured can be reduced. Thirdly, a new optical head in which a head flexible wiring board for electrical connection of each component such as a light source or a light-receiving device is incorporated and fixed can be realized. Thus, as a whole, a compact optical head can be achieved.

In the first optical head, it is preferable that the light-receiving device is configured such that a protective resin for preventing damage is fixed to the flexible wiring board while covering only the metal wire or both the metal wire and the light-receiving chip. Thus, only the metal wire, which is the most susceptible to damage, or the light-receiving surface side of the light-receiving chip as well as the metal wire, which is the most susceptible to damage, can be protected from external damage, so that the light-receiving device can be handled more easily.

In this case, it is preferable that the flexible wiring board is a part of a head flexible wiring board for connecting electrically between the light source and the means for driving a focusing element, and an external circuit. Thus, the flexible wiring board is not a component dedicated to the light-receiving device, so that an even more compact and simplified optical head can be achieved.

Furthermore, it is preferable that the light source is a light-emitting chip element, and the light-emitting chip element is connected electrically to the flexible wiring board by attaching directly or via a metal wire. Thus, the size of the optical head can be reduced, and the head flexible wiring board can be simplified.

In order to achieve the above object, a second optical head of the present invention includes a light source, means for driving a focusing element, a light-receiving device for receiving light reflected from an information recording medium, wherein the light-receiving device comprises a light-receiving chip having a plurality of electrodes, and a multilayered substrate with an internal conduction line on which the light-receiving chip is mounted and fixed, and the plurality of electrodes are connected electrically to the multilayered substrate with an internal conduction line by attaching directly or via a metal wire.

With this configuration, the area of the light-receiving device is not increased while utilizing the features of the multilayered substrate with an internal conduction line and the three-dimensionally arranged electrical conduction lines in a simple configuration without increasing the number of the components. Therefore, firstly, a light-receiving device that is more compact and thinner than conventional light-receiving devices can be realized. Secondly, the size of the flexible multilayered substrate with an internal conduction line in which the light-receiving device is configured can be reduced. Thirdly, a new optical head in which a head flexible wiring board for electrical connection of each component such as a light source or a light-receiving device is incorporated and fixed can be realized, which will be described later. Thus, as a whole, a compact optical head can be achieved.

In the second optical head, it is preferable that the light-receiving device is configured such that a protective resin for preventing damage is fixed to the multilayered substrate with an internal conduction line while covering only the metal wire or both the metal wire and the light-receiving chip. Thus, only the metal wire, which is the most susceptible to damage, or the light-receiving surface side of the light-receiving chip as well as the metal wire, which is the most susceptible to damage, can be protected from external damage, so that the light-receiving device can be handled more easily.

In this case, the multilayered substrate with an internal conduction line is connected electrically to a head flexible wiring board for electrical connection of the light source and the means for driving a focusing element. Thus, the multilayered substrate with an internal conduction line is not a component dedicated to the light-receiving device, so that an even more compact and simplified optical head can be achieved.

Furthermore, it is preferable that the light source is a light-emitting chip element, and the light-emitting chip element is connected electrically to the head flexible wiring board by attaching directly or via a metal wire. Thus, the size of the optical head can be reduced, and the head flexible wiring board can be simplified.

Alternatively, it is preferable that the light source is a light-emitting chip element, and the light-emitting chip element is connected electrically to a multilayered substrate with an internal conduction line that is the same as or different from the multilayered substrate with an internal conduction line, by attaching directly or via a metal wire. Thus, the light source and the light-receiving device are configured integrally as one unit as a so-called light-receiving and emitting element, so that an even more compact optical head can be achieved.

Furthermore, in the first and the second optical heads, it is preferable that the light-receiving chip of the light-receiving device comprises a light-receiving cell on which light is incident, and a circuit portion for amplifying and processing a photoelectric current from the light-receiving cell. Thus, the output from the light-receiving cell is not a photoelectric current, but a voltage output, including in the case where processing is performed, and more stable outputs can be obtained from the optical head.

The present invention includes the case where the light-receiving cell and the circuit portion are configured as totally separated elements. In this case, in the light-receiving chip of the light-receiving device, it is preferable that the light-receiving cell and the circuit portion are provided independently from each other on front and back faces of the flexible wiring board for the first optical head, and the multilayered substrate with an internal conduction line for the second optical head. Thus, even if the light-receiving device is a light-receiving device incorporating an electric circuit, the so-called radiation sensitivity of the light-receiving device can be increased, without increasing the area of the light-receiving device.

In the first and the second optical heads, the light-receiving device is a RF signal detecting element for detecting an information signal of the information recording medium or a servo signal detecting element for detecting a serve signal from the information recording medium. Thus, the size limit in the height direction of the optical head is not determined by the detecting portion.

Alternatively, the light-receiving device is a sensor used to detect a tilt of the information recording medium or a tilt of the means for driving a focusing element, or to confirm a light amount emitted from the light source. Thus, although a specific detecting sensor can be configured, the height or the size of the optical head is not increased.

In the first optical head, it is preferable that a light-receiving chip mounting portion of the flexible wiring board has a plurality of parallel conduction lines, and the light-receiving chip is mounted on the flexible wiring board such that a major division line is substantially parallel to the plurality of conduction lines, and that the light-receiving chip is mounted substantially in the center of the light-receiving chip mounting portion of the flexible wiring board. Thus, the advantage that the size limit in the height direction of the optical head is not determined by the detecting portion can become more pronounced.

In the second optical head, it is preferable that a light-receiving chip mounting portion of the head flexible wiring board has a plurality of parallel conduction lines, and the light-receiving chip mounted and fixed onto the multilayered substrate with an internal conduction line is mounted on the head flexible wiring board such that a major division line is substantially parallel to the conduction lines, and that the multilayered substrate with an internal conduction line is mounted substantially in the center of the light-receiving chip mounting portion of the head flexible wiring board. Thus, the advantage that the size limit in the height direction of the optical head is not determined by the detecting portion can become more pronounced.

BEST MODE FOR CARRYING OUT THE INVENTION

Hereinafter, embodiments of the present invention will be described with reference of the accompanying drawings.

Embodiment 1

Figure 1A:
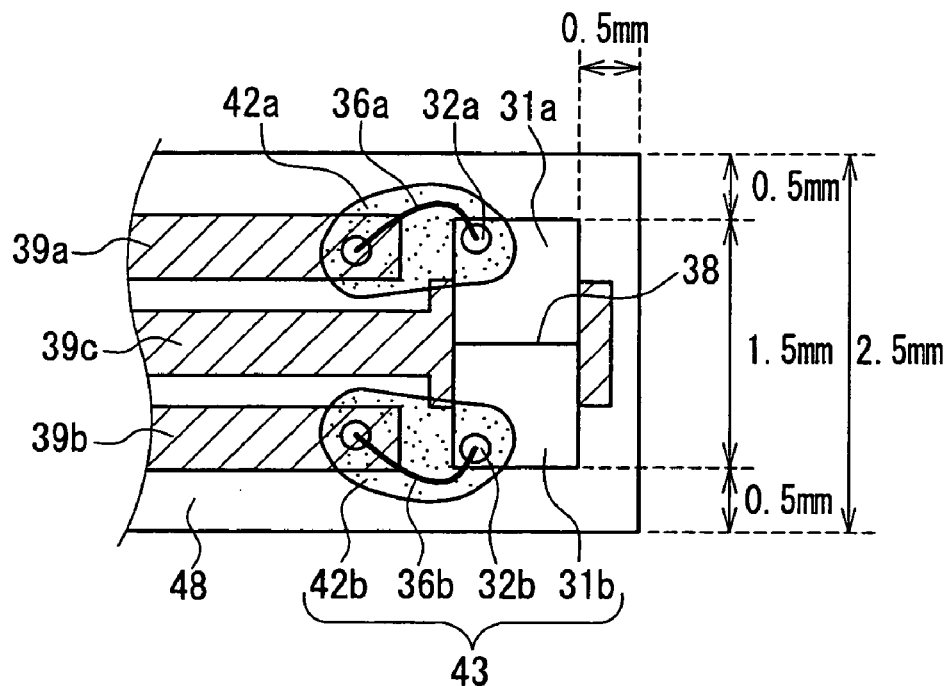
FIG. 1A is a plan view showing an example of a configuration of a halved light-receiving device in an optical head according to Embodiment 1 of the present invention.
Figure 1B:
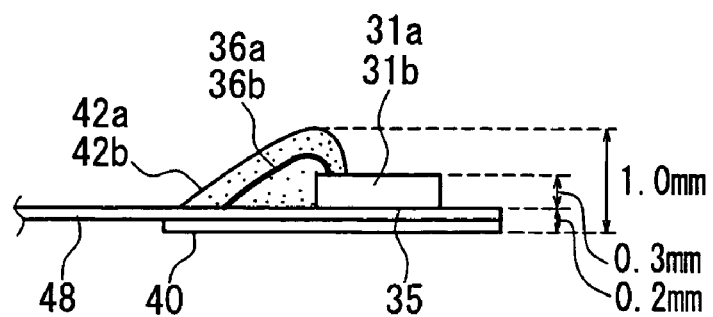
FIG. 1B is a cross-sectional view of the halved light-receiving device shown in FIG. 1A.
Figure 7:
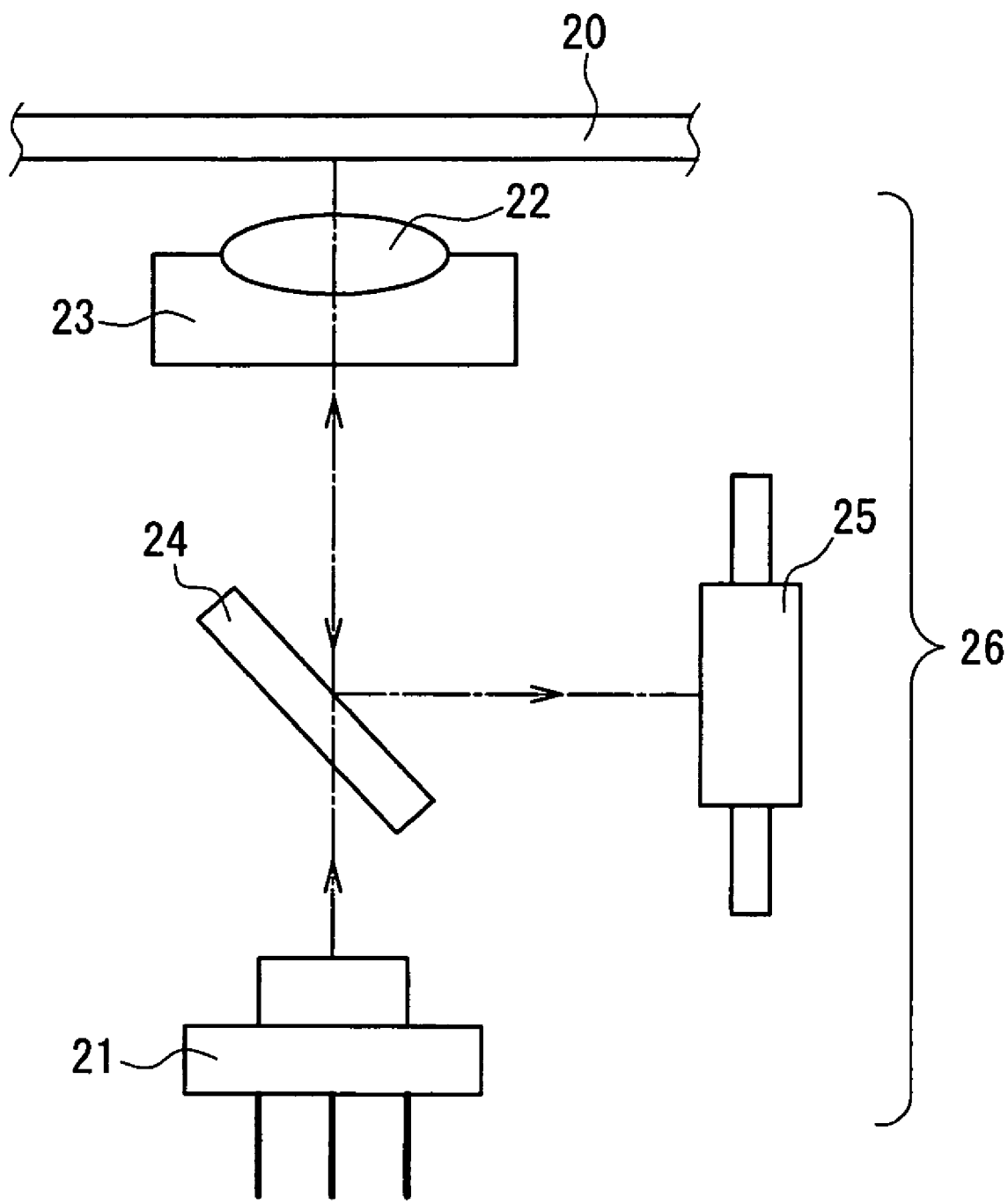
FIG. 7 is a schematic view showing the configuration of a general optical head.
Figure 8A:
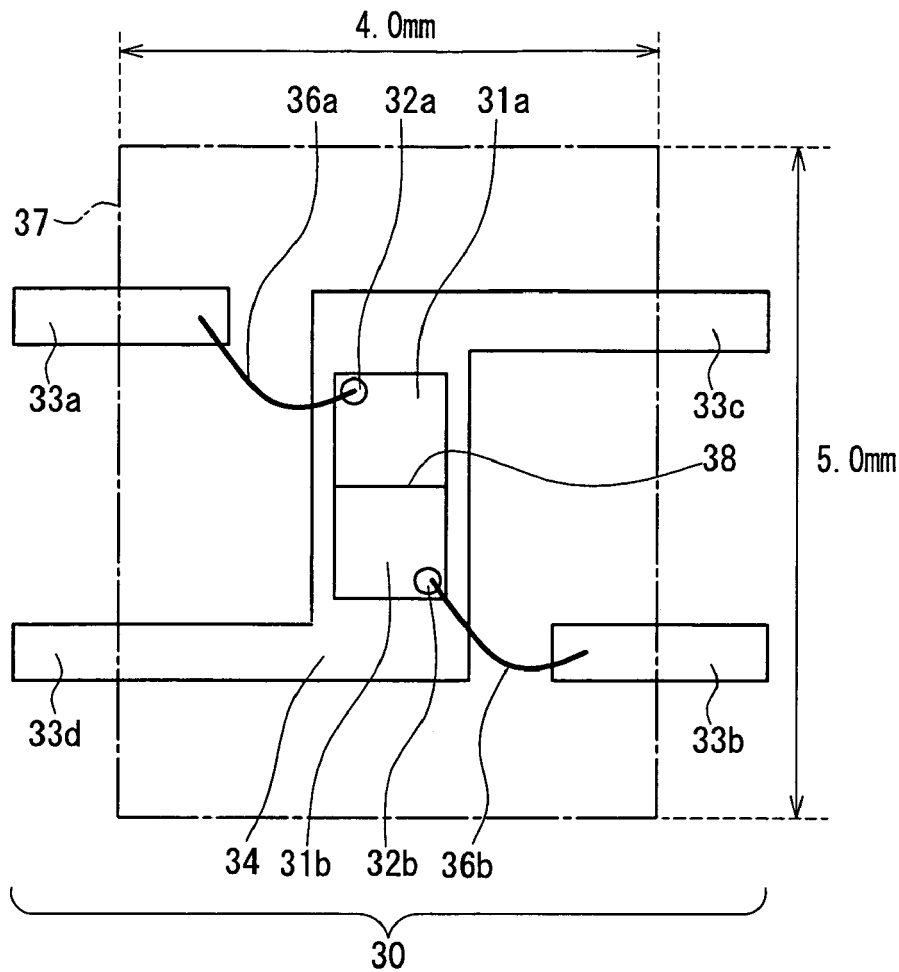
FIG. 8A is a plan view showing the configuration of a halved photodiode that is a light-receiving device in a conventional optical head.
Figure 8B:
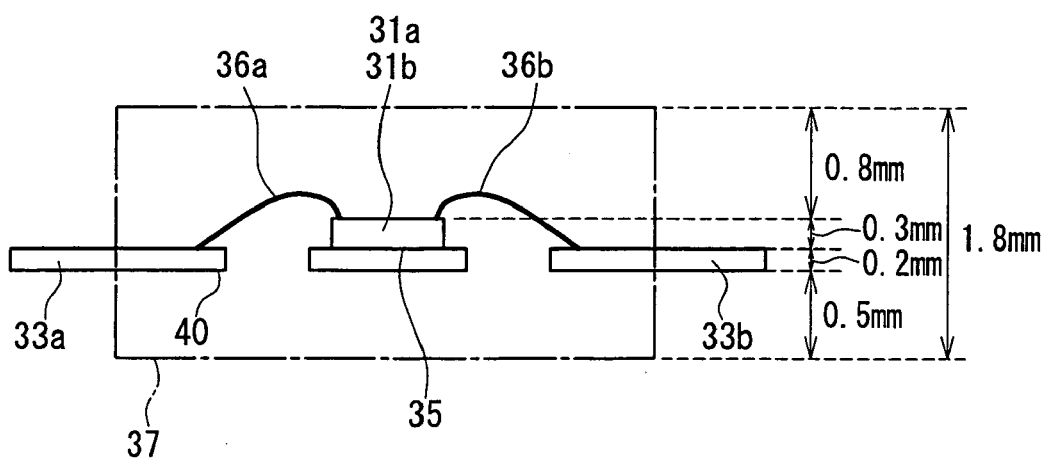
FIG. 8B is a cross-sectional view of the halved photodiode shown in FIG. 8A.

FIGS. 1A and 1B are a plan view and a cross-sectional view showing an example of a configuration of a halved light-receiving device in an optical head according to Embodiment 1 of the present invention, and the configuration and the function thereof will be described below. The light-receiving device of FIGS. 1A and 1B can be used as a component of the optical head, as in the case of the light-receiving device 25 of the general optical head shown in FIG. 7.

In FIGS. 1A and 1B, reference numerals 31a and 31b denote light-receiving chips that are semiconductors (whose structure is not described in detail) and have an area of 0.75 mm×0.75 mm and a thickness of 0.3 mm. Reference numeral 38 denotes a division line that divides the light-receiving chips 31a and 31b. Reference numerals 32a and 32b denote front face electrodes provided on the light-receiving chips 31a and 31b, respectively. Reference numeral 35 denotes a back face electrode that is provided commonly to the light-receiving chips 31a and 31b. Reference numeral 48 denotes a flexible wiring board. Reference numerals 39a, 39b and 39c denote conduction lines on the flexible wiring board. Reference numeral 40 denotes a reinforcing plate that is made of epoxy material containing glass and is adhered to the flexible wiring board 48 so as to form an integral unit. Reference numeral 36a denotes a metal wire for electrically connecting the electrode 32a and the conduction line 39a. Reference numeral 36b denotes a metal wire for electrically connecting the electrode 32b and the conduction line 39b. Reference numerals 42a and 42b denote protective resins for covering the metal wires 36a and 36b and being fixed to the flexible wiring board 48. These components above constitute a halved light-receiving device 43.

The light-receiving chips 31a and 31b are connected electrically to the conduction line 39c of the flexible wiring board 48 with the back electrode 35. The front face electrodes 32a and 32b are connected electrically to the conduction lines 39a and 39b of the flexible wiring board 48 by the metal wires 36a and 36b, respectively. The protective resins 42a and 42b are resins that can be cured by ultraviolet rays, and can prevent damage or breakage of the metal wires 36a and 36b, which exhibit the function of electrical connection. Therefore, the halved light-receiving device 43 has the conduction lines 39a and 39b as anode terminals, the conduction line 39c as a cathode terminal and serves as a so-called halved photodiode while the light received by the light-receiving chips 31a and 31b is output to the conduction lines 39a and 39b, respectively, in the form of a photoelectric current. For each size, substantial values are shown. The halved light-receiving device 43 is a photodiode, so that the light-receiving chips 31a and 31b also can be referred to as "light-receiving cells". Herein, other elements or functions that constitute the optical head but are not relevant to the present invention are not shown or described.

Figure 9A:
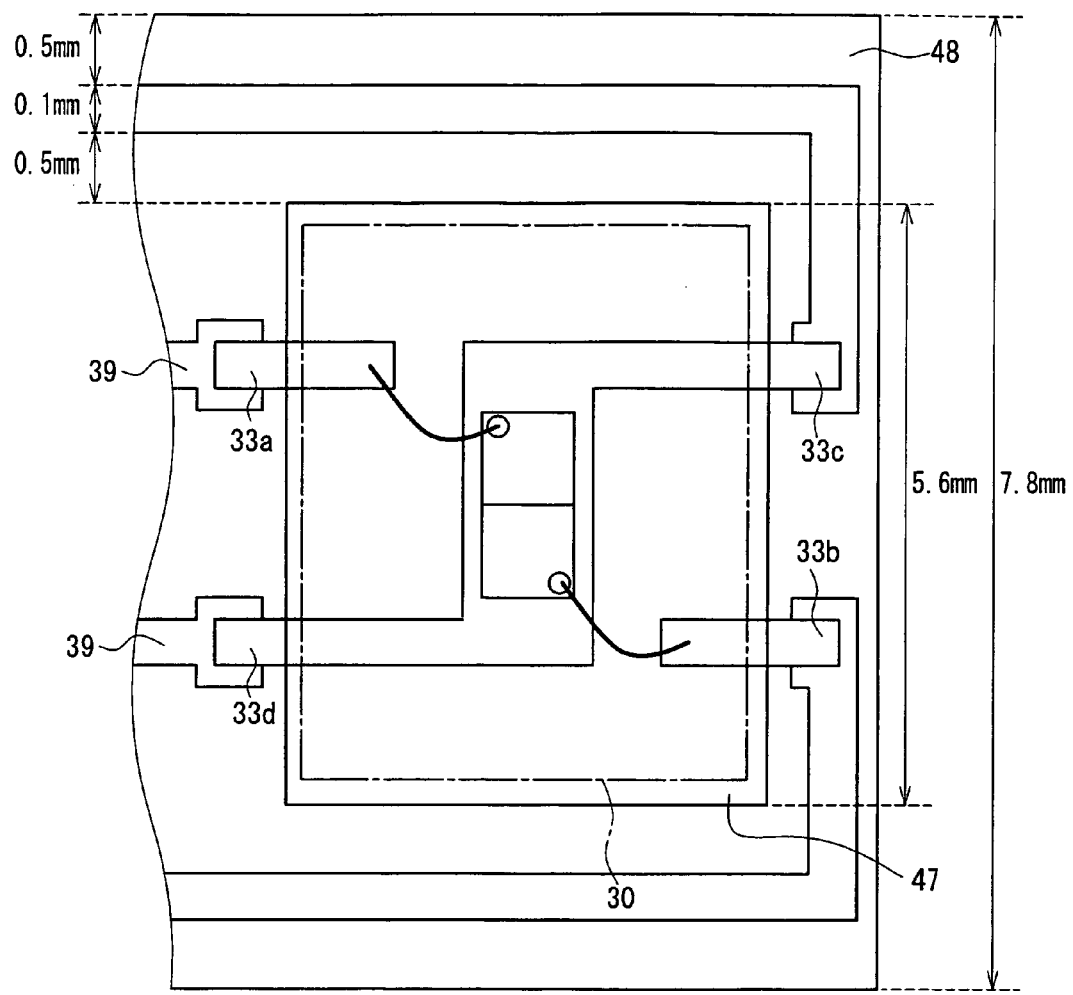
FIG. 9A is a plan view showing the configuration in which the conventional halved photodiode shown in FIGS. 8A and 8B is connected electrically to a flexible wiring board.
Figure 9B:
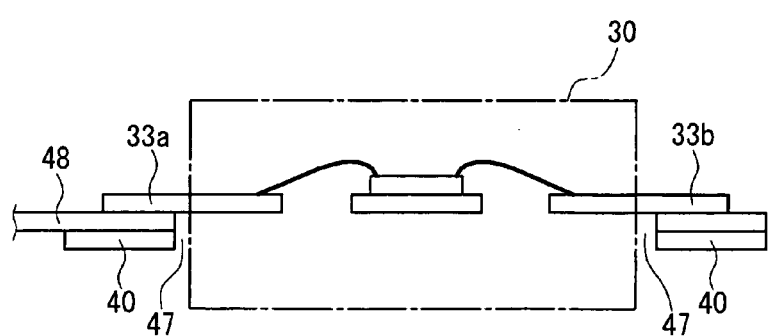
FIG. 9B is a cross-sectional view showing the configuration in which the conventional halved photodiode shown in FIGS. 8A and 8B is connected electrically to a flexible wiring board.

Thus, in Embodiment 1 of the present invention, when comparing the halved light-receiving device 43 of FIGS. 1A and 1B with the conventional configuration shown in FIGS. 9A and 9B, the embodiment of the present invention firstly can realize a compact and thin halved light-receiving device 43 without increasing the number of the components and secondly also can realize a compact flexible wiring board on which the halved light-receiving device 43 is configured. Therefore, the present invention can provide an excellent effect that an optical head on which they are mounted can be compact.

Referring to more specific values, in FIG. 1A, when it is assumed that the space width between the conduction lines 39a and 39b and the outline of the flexible wiring board 48 is 0.5 mm, the size of the flexible wiring board 48 is 2.5 mm, whereas the size in the longitudinal direction (direction perpendicular to the division line 38) of the light-receiving chips 31a and 31b is 1.5 mm. The outline of the flexible wiring board 48 is projected from the light-receiving chips 31a and 31b only by about 0.5 mm in the upper right end portion in the drawing.

Figure 2A:
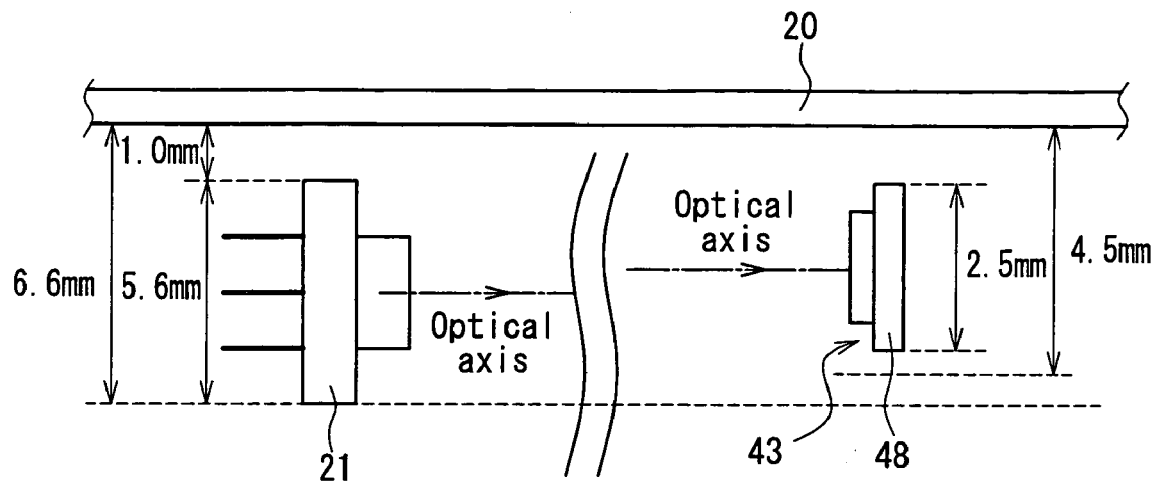
FIG. 2A is a side view of an optical head according to Embodiment 1 of the present invention, showing the positional relationship between the optical disk and the light-receiving device for detecting RF signals and detecting servo signals.
Figure 10A:
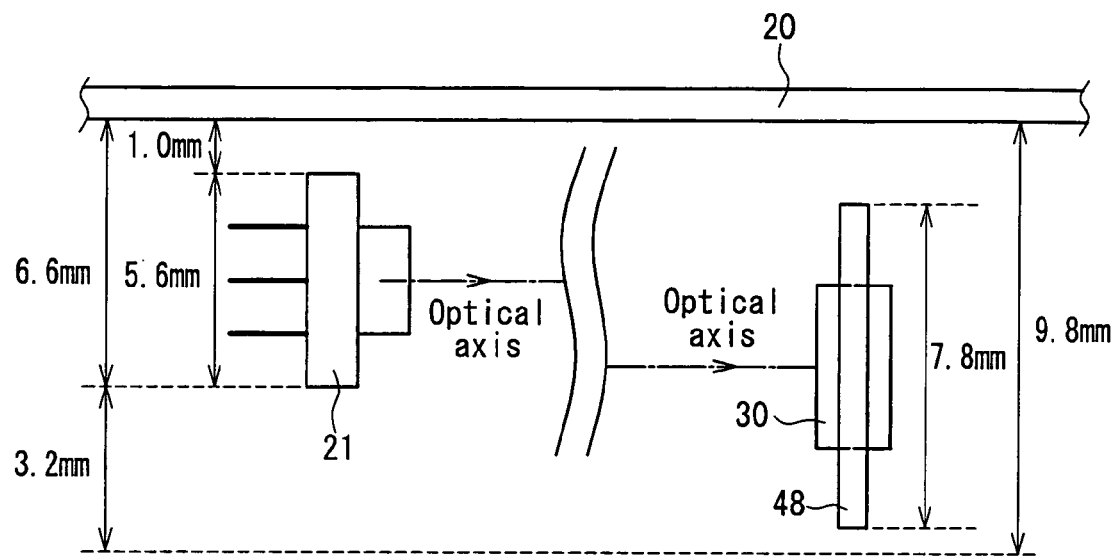
FIG. 10A is a side view of a conventional optical head, showing the positional relationship between the optical disk and the light-receiving device for detecting RF signals and detecting servo signals.
Figure 10B:
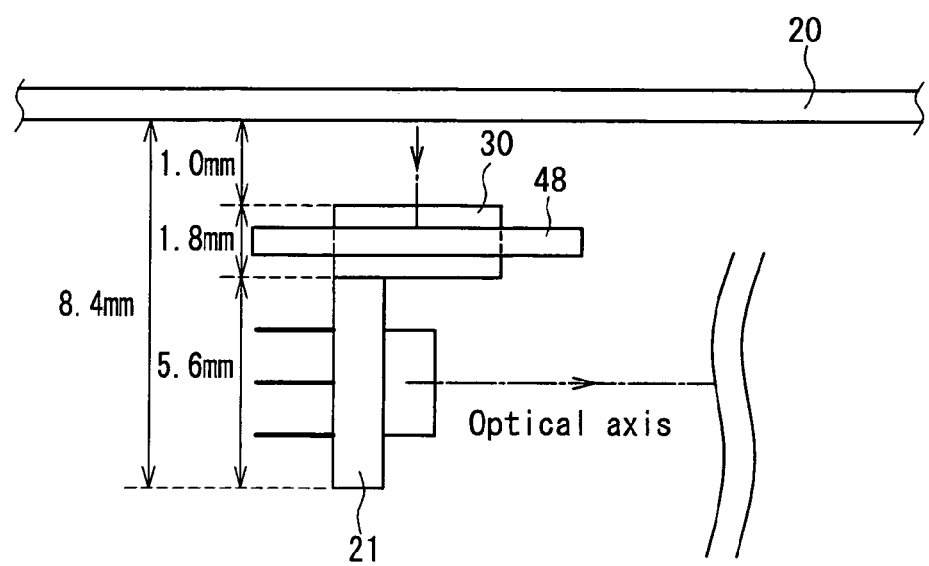
FIG. 10B is a side view of a conventional optical head, showing the positional relationship of the optical disk and the light-receiving device for detecting a tilt.

FIG. 2A is a side view of the optical head and schematically shows the positional relationship between the optical disk 20, the semiconductor laser 21, which is a light source, and the light-receiving device 43 for detecting RF signals and detecting servo signals shown in FIGS. 1A and 1B of this embodiment. As can be seen from FIG. 2A, assuming that the components are spaced apart from the optical disk 20 by 1 mm, when the light-receiving device 43 of the detecting portion is the halved photodiode shown in FIGS. 1A and 1B, the size of the flexible wiring board 48 of the detecting portion is 2.5 mm, as described above. The light-receiving device 43 is adjusted so as to be positioned in a plane perpendicular to the optical axis so that the optical head can exhibit its performance, and it is assumed that the moving range thereof is ±0.5 mm. That is, the detecting portion requires a space of 1 mm, a moving amount of 0.5 mm, a width of the flexible wiring board 48 of 2.5 mm, and a moving amount of 0.5 mm, which makes 4.5 mm from the optical disk 20. Thus, the detecting portion on which the light-receiving device 43 for detecting RF signals and detecting servo signals, which is essential to the optical head, is mounted is not projected from the light source portion, unlike the conventional example shown in FIG. 10A. In other words, the size limit in the height direction of the optical head is not determined by the detecting portion.

Figure 2B:
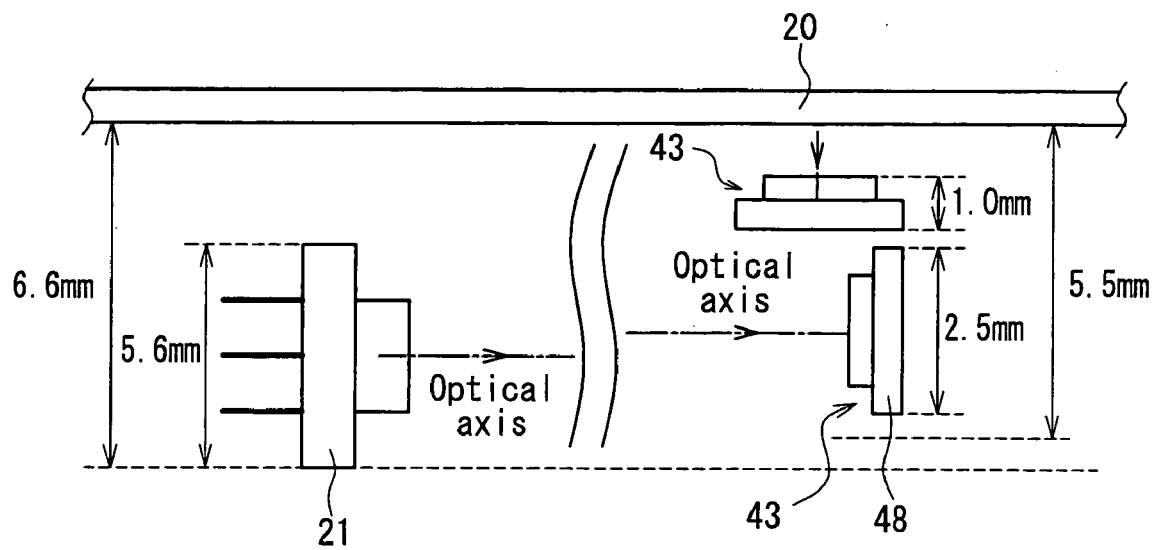
FIG. 2B is a side view of an optical head according to Embodiment 1 of the present invention, showing the positions of the optical disk and the light-receiving device for detecting a tilt.

Next, the case of a sensor for detecting, for example, a tilt of a information recording medium, instead of the light-receiving device for detecting RF signals and detecting servo signals is mounted, which is essential to the optical head, will be considered. Referring to FIG. 2B, the sensor is provided in parallel to the optical disk 20 so as to detect a tilt of the optical disk 20, for example, in a space above the light-receiving device 43 for detecting RF signals and detecting servo signals. When this sensor is a halved photodiode that is the light-receiving device shown in FIGS. 1A and 1B, its thickness is 1.0 mm. That is, the detecting portion requires a space of 1 mm, a thickness of the sensor (halved photodiode that is a light-receiving device) of 1.0 mm, a moving amount of 0.5 mm, a width of the flexible wiring board 48 of 2.5 mm, and a moving amount of 0.5 mm, which makes 5.5 mm from the optical disk 20. Since this is smaller than the size of the light source portion of 6.6 mm, a tilt detecting sensor of the optical disk 20 can be configured without increasing the height of the optical head.

In this embodiment, the protective resins 42a and 42b are fixed to the flexible wiring board 48 while covering the metal wires 36a and 36b, but they may be fixed to the flexible wiring board 48 while covering the light-receiving chips 31a and 31b on the side of the light-receiving surface as well as the metal wires 36a and 36b. In this configuration, not only the metal wires 36a and 36b, which are the most susceptible to damage, but also the light-receiving surface of the light-receiving chips 31a and 31b can be protected from external damage, so that the halved light-receiving device 43 can be handled more easily.

Figure 3:
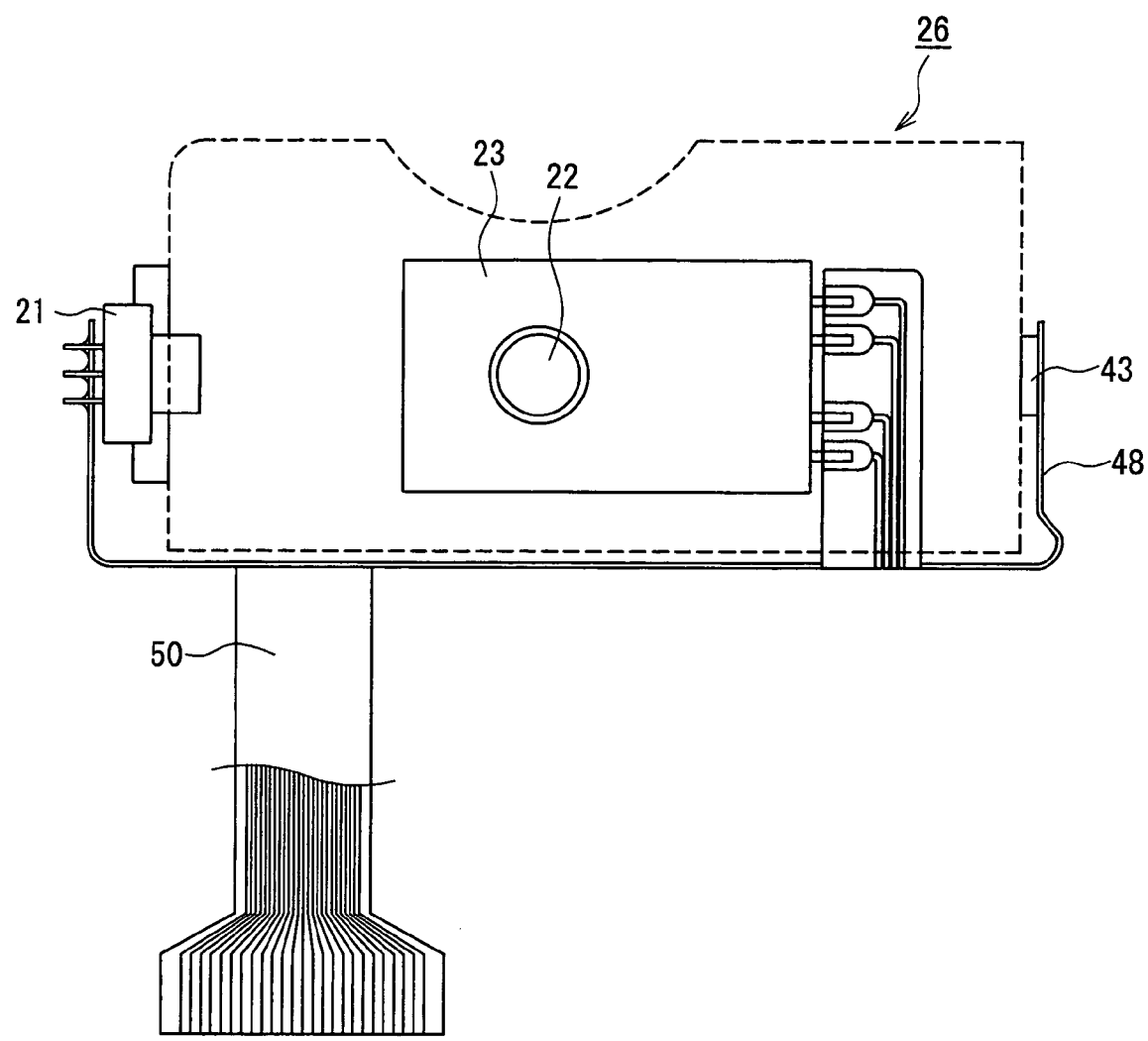
FIG. 3 is a plan view of the entire configuration of an optical head according to Embodiment 1 of the present invention, in the case where the flexible wiring board 48 is configured as a part of a head flexible wiring board 50.

In this embodiment, in the flexible wiring board 48, only the peripheral portion of the halved light-receiving device 43 is shown for example, but the flexible wiring board 48 may be a part of a head flexible wiring board for electrical connection of a light source or means for driving a light focusing element. FIG. 3 is a plan view of the entire configuration of an optical head according to Embodiment 1 of the present invention, in the case where the flexible wiring board 48 is configured as a part of a head flexible wiring board 50. In FIG. 3, the head flexible wiring board 48 is a part of the head flexible wiring board 50 for electrical wiring between a semiconductor laser 21, an objective lens actuator 23 for driving an objective lens 22 and the halved light-receiving device 43 and an external circuit. Thus, the flexible wiring board 48 is not a component dedicated to the halved light-receiving device 43, so that an even more compact and simplified optical head can be achieved. This is because a method for connecting electrically the head flexible wiring board and the components or a method for arranging the head flexible wiring board itself in the optical head (method for routing conduction lines) can be simplified.

Figure 4:
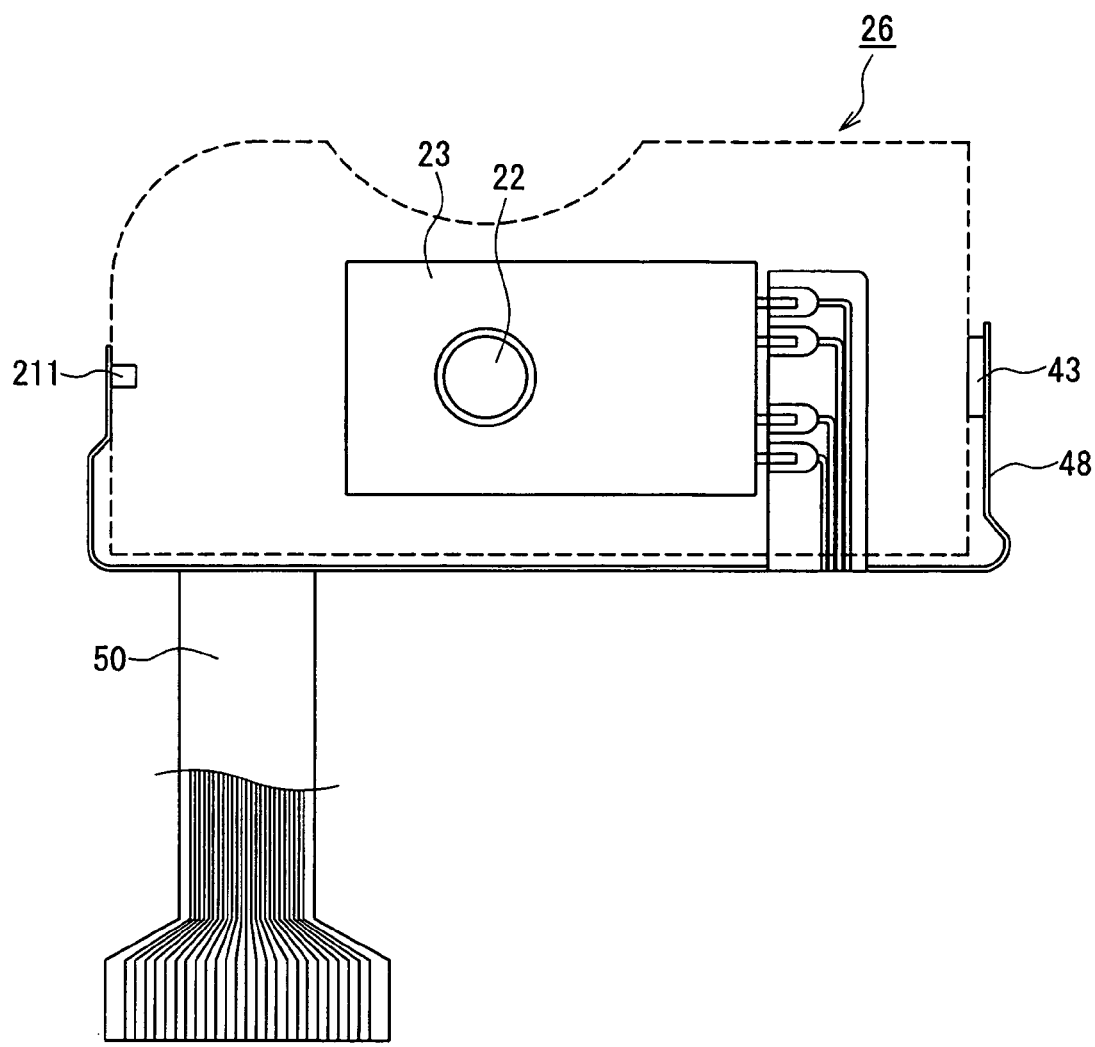
FIG. 4 is a plan view of the entire configuration of an optical head according to Embodiment 1 of the present invention, in the case where the semiconductor laser 21 of FIG. 3 is replaced by a light-emitting chip element 211.

As shown in FIG. 4, the light source may be a light-emitting chip element 211, and the light-emitting chip element 211 may be connected electrically to the flexible wiring board 48 by attaching directly or via a metal wire. In other words, the light source is not the semiconductor laser 21 that is packaged with a diameter of 5.6 mm as shown in FIG. 2A, but a semiconductor chip that emits light and has a size of less than 1 mm$^3$ as shown in FIG. 4 is connected electrically to the flexible wiring board, so that a compact optical head and a simplified head flexible wiring board can be achieved.

In this embodiment, the halved light-receiving device 43 is assumed to be a photodiode, as understood from the fact that the light-receiving chips 31a and 31b are referred to as "light-receiving cells". However, each of the light-receiving chips 31a and 31b may be a light-receiving device incorporating an electric circuit that is constituted by a light-receiving cell to which light is incident and a circuit portion for amplifying and processing a photoelectric current from the light-receiving cell. In this case, the output from the light-receiving cells is not a photoelectric current, but a voltage output, including the case where processing is performed. Thus, more stable outputs can be obtained from the optical head.

In this embodiment, the case where the halved light-receiving device 43 is a RF signal detecting element for detecting information signals of an information recording medium or a servo signal detecting element for detecting serve signals from an information recording medium, or a sensor for detecting of a tilt of an information medium has been described for example. However, the halved light-receiving device 43 can be any light-receiving device that can be used in an optical head, such as a sensor used to detect a tilt of means for driving a focusing element or to confirm the light amount emitted from a light source.

In this embodiment, as shown in FIG. 1A, the light-receiving chip mounting portion of the light-receiving device 43 of the flexible wiring board 48 is configured to have a size of 2.5 mm, which is about the same size as the length of the longitudinal side of the light-receiving chips 31a and 31b, which is 1.5 mm, as opposed to the conventional example shown in FIG. 9A. Thus, as shown in FIG. 2A, the size limit in the height direction of the optical head is not determined by the detecting portion.

Furthermore, in this embodiment, as shown in FIG. 1A, the light-receiving chip mounting portion of the light-receiving device 43 of the flexible wiring board 48 has three parallel conduction lines 39a, 39b and 39c, and the light-receiving chips 31a and 31b are mounted on the flexible wiring board 48 such that the major division line 38 is substantially parallel to these conduction lines. In addition, the light-receiving chips 31a and 31b are mounted substantially in the center of the flexible wiring board 48. This configuration can make the advantage that the size limit in the height direction of the optical head is not determined by the detecting portion more pronounced, as shown in FIG. 2A.

As described above, by developing the configuration of this embodiment shown in FIGS. 1A and 1B, not only can the size of the halved light-receiving device 43, which is a light-receiving device, be reduced in the peripheral portion, but also a new optical head in which a head flexible wiring board for electrical connection of each component such as a light source or a light-receiving device is incorporated and fixed can be configured.

Embodiment 2

Figure 5A:
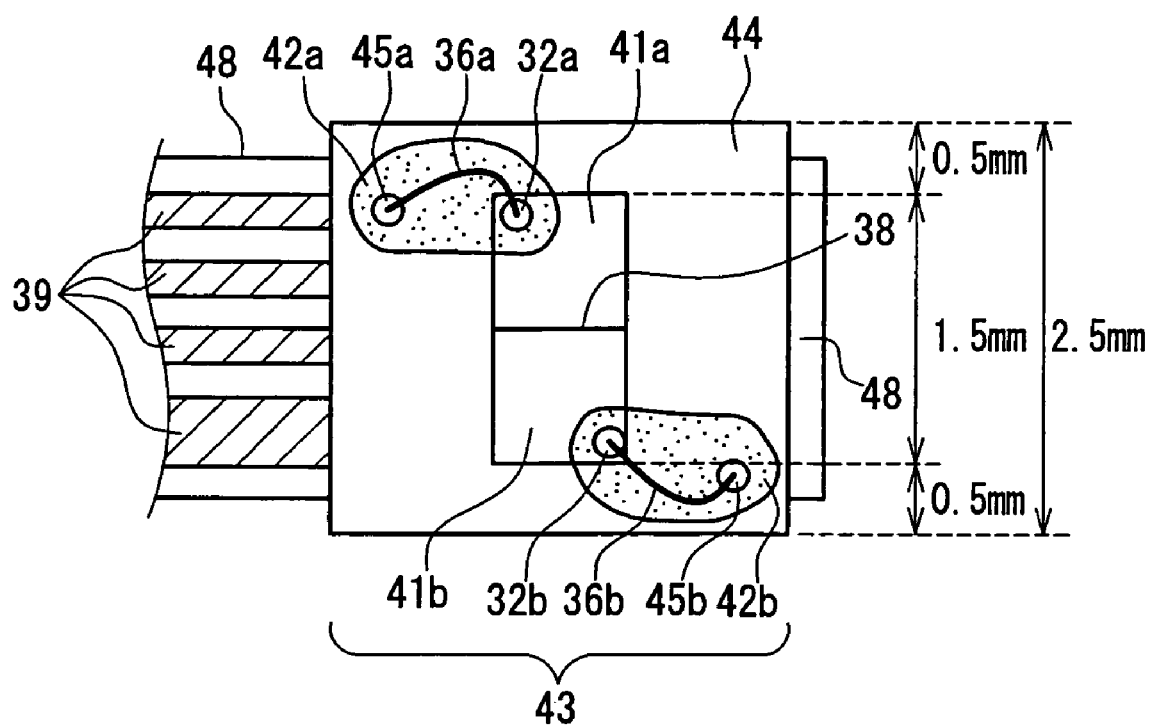
FIG. 5A is a plan view showing an example of a configuration of a halved light-receiving device incorporating an electric circuit in an optical head according to Embodiment 2 of the present invention.
Figure 5B:
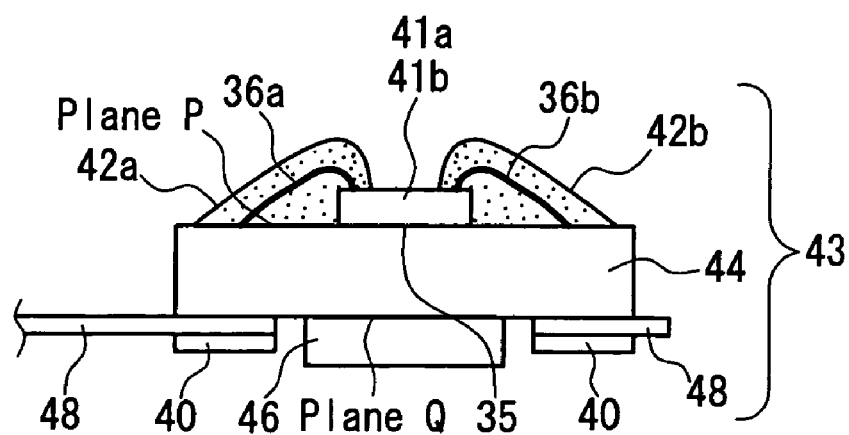
FIG. 5B is a cross-sectional view showing the halved light-receiving device incorporating an electric circuit of FIG. 5A.

FIGS. 5A and 5B are a plan view and a cross-sectional view showing a halved light-receiving device incorporating an electric circuit in the optical head according to Embodiment 2 of the present invention, and the configuration and the function thereof will be described below. The halved light-receiving device incorporating an electric circuit of FIGS. 5A and 5B can be used as a component of the optical head, as in the case of the light-receiving device 25 of the general optical head shown in FIG. 7.

In FIGS. 5A and 5B, reference numerals 41a and 41b denote light-receiving cells that are semiconductors (whose structure is not described in detail) and have an area of 0.75 mm×0.75 mm and a thickness of 0.3 mm. Reference numeral 38 denotes a division line that divides the light-receiving cells 41a and 41b. Reference numerals 32a and 32b denote front face electrodes provided on the light-receiving cells 41a and 41b, respectively. Reference numeral 35 denotes a back face electrode that is provided commonly to the light-receiving cells 41a and 41b. Reference numeral 44 denotes a multilayered substrate with an internal conduction line, on a plane P of which the light-receiving cells 41a and 41b are mounted and fixed. Reference numerals 45a and 45b denote metal leads provided on the multilayered substrate 44 with an internal conduction line. Reference numeral 36a denotes a metal wire for electrically connecting the electrode 32a and the metal lead 45a. Reference numeral 36b denotes a metal wire for electrically connecting the electrode 32b and the metal lead 45b. Reference numerals 42a and 42b denote protective resins for covering the metal wires 36a and 36b and being fixed to the multilayered substrate 44 having an internal conduction line. Reference numeral 46 denotes a circuit portion for amplifying and processing a photoelectric current from the light-receiving cells 41a and B41b, and is connected electrically to, and mounted on and fixed to a plane Q that is the back face of the multilayered substrate 44 with an internal conduction line with respect to the light-receiving cells 41a and 41b. The above-described components constitute a halved light-receiving device 43 incorporating an electric circuit that is a light-receiving device. In this embodiment, the light-receiving chip is constituted by the light-receiving cells 41a and 41b and the circuit portion 46. Reference numeral 48 denotes a flexible wiring board for electrically connecting, and mounting and fixing the multilayered substrate 44 with an internal conduction line. Reference numeral 40 denotes a reinforcing plate that is made of epoxy material containing glass and is adhered to the flexible wiring board 48 so as to form an integral unit. Reference numerals 42a and 42b denote resins that can be cured by ultraviolet rays, and can prevent damage or breakage of the metal wires 36a and 36b that carry out the function of electrical connection.

The light-receiving cells 41a and 41b are connected electrically to the metal lead (not shown) on the plane P of the multilayered substrate 44 with an internal conduction line via the back face electrode 35. The front face electrodes 32a and 32b are connected electrically to the metal leads 45a and 45b of the multilayered substrate 44 with an internal conduction line by the metal wires 36a and 36b, respectively. In the internal structure of the multilayered substrate 44 provided with an internal conduction line, a plurality of layers that are provided with metal wires are stacked and electrical connection between the layers is established by metal holes, so that in the multilayered substrate 44 with an internal conduction line, electric wiring is performed three-dimensionally, including the portion between the plane P of the front face and the plane Q of the back face.

As the multilayered substrate 44 with an internal conduction line, a multilayered ceramic substrate or a multilayered print substrate can be used. When a multilayered ceramic substrate is used, an advantage of easy processing and molding can be provided. When a multilayered print substrate is used, an advantage of excellent mass productivity can be provided.

In the halved light-receiving device 43 incorporating an electric circuit, which is a light-receiving device, the light received by the light-receiving cells 41a and 41b arranged on the plane P flows in the form of a photoelectric current from the metal leads 45a and 45b through the electrical conduction lines (not shown) inside the multilayered substrate 44 with an internal conduction line to the circuit portion 46 on the plane Q of the back face of the multilayered substrate 44 with an internal conduction line. A plurality of electrodes (not shown) of the circuit portion 46 are connected electrically to a plurality of metal leads (not shown) provided on the plane Q of the multilayered substrate 44 with an internal conduction line by, for example, a bump method. In this circuit portion 46, the photoelectric current from the light-receiving cells 41a and 41b is amplified and processed so that electric signals necessary to the optical head are output as a voltage. All the electric signals that are output as a voltage and the electric signals necessary to operate the circuit portion 46 are input and output through the plurality of metal leads (not shown) provided on the plane Q of the multilayered substrate 44 with an internal conduction line and the electrical conduction lines provided on the plane Q by the conduction lines (not shown) of the flexible wiring board 48. The electrical conduction lines provided on the plane Q of the multilayered substrate 44 with an internal conduction line and the conduction lines of the flexible wiring board 48 are connected electrically to each other in the contact portion of the plane Q and the flexible wiring board 48 by, for example, a bump method. Herein, other elements or functions that constitute the optical head but are not relevant are not shown or described.

Figure 6:
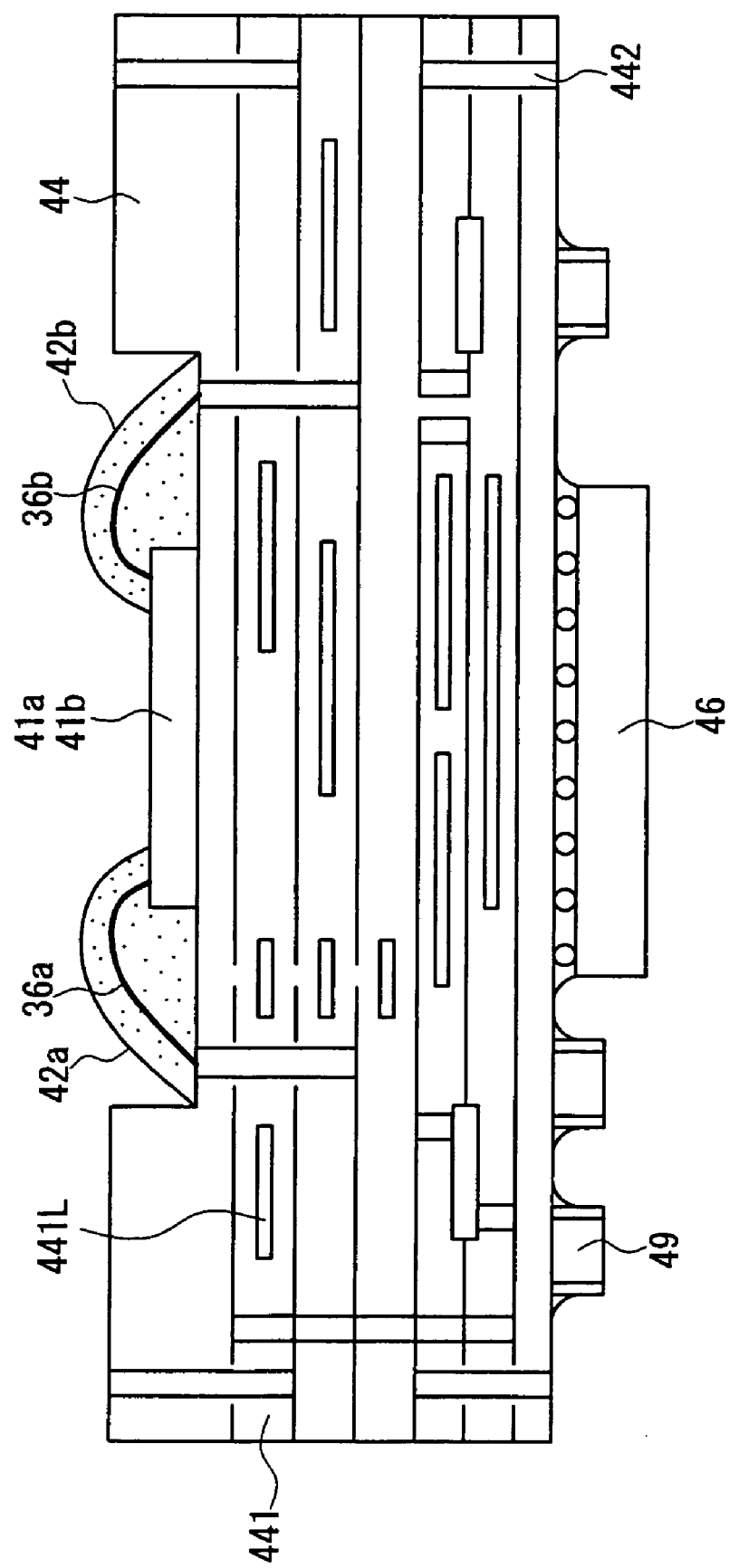
FIG. 6 is a cross-sectional view showing in detail the multilayered substrate on which the halved light-receiving device incorporating an electric circuit of FIG. 5B is configured.

FIG. 6 is a cross-sectional view showing in detail the multilayered substrate in which the halved light-receiving device incorporating an electric circuit of FIG. 5B is configured. In FIG. 6, the light-receiving cells 41a and 41b are arranged in a recess in the uppermost layer, unlike those in FIG. 5B. The multilayered substrate 44 is constituted by laminating layers 441 including a metal wire 441L, and electrical connection of the layers is established via a metal hole 442. Reference numeral 49 denotes a surface mounted component that is mounted on the same surface as the circuit portion 46.

Thus, in this embodiment, when comparing the halved light-receiving device 43 incorporating an electric circuit, which is a light-receiving device, shown in FIGS. 5A and 5B with the conventional configuration shown in FIGS. 9A and 9B, the embodiment of the present invention firstly can realize a compact and thin light-receiving device 43 without increasing the number of the components and secondly also can realize a compact flexible wiring board 48 on which the light-receiving device 43 is mounted.

Referring to more specific values, in FIG. 5A, when it is assumed that the space width with respect to the outline of the multilayered substrate 44 with an internal conduction line is 0.5 mm, the size of the multilayered substrate 44 with an internal conduction line is 2.5 mm, whereas the size in the longitudinal direction (direction perpendicular to the division line 38) of the light-receiving cells 41a and 41b is 1.5 mm. The size in the longitudinal direction (direction perpendicular to the division line 38) of the flexible wiring board 48 can be smaller than the size of the multilayered substrate 44 with an internal conduction line. Therefore, the size in the longitudinal direction (direction perpendicular to the division line 38) of the halved light-receiving device 43 incorporating an electric circuit, which is a light-receiving device, can be 2.5 mm. Consequently, the specific size of a compact optical head is such that the detecting portion is positioned with 4.5 mm from the optical disk 20, as described in Embodiment 1 referring to FIG. 2A. The detecting portion on which the light-receiving device 43 for detecting RF signals and detecting servo signals, which is essential to the optical head, is mounted is not projected from the light source portion, unlike the conventional example described referring to FIG. 10A. In other words, the size limit in the height direction of the optical head is not determined by the detecting portion.

Thus, although this embodiment is a light-receiving device 43 incorporating an electric circuit of a type in which the light-receiving cells 41a and 41b and the circuit portion 46 are configured as totally separate elements, the multilayered substrate 44 with an internal conduction line and its three-dimensionally arranged electrical conduction lines prevent the area of the light-receiving device from increasing. Therefore, an excellent effect can be obtained in that a compact optical head on which they are mounted can be realized. Furthermore, since this is a halved light-receiving device 43 incorporating an electric circuit, the output from the light-receiving cells 41a and 41b is a voltage output, including the case where processing is performed, and thus more stable outputs can be obtained from the optical head.

Moreover, although this embodiment is a light-receiving device 43 incorporating an electric circuit, it is not a type in which the light-receiving cells and the circuit portion are configured on the same semiconductor substrate, but the light-receiving cells 41a and 41b and the circuit portion 46 are configured as totally separate elements. Therefore, an effect can be obtained in that so-called the radiation sensitivity of the light-receiving device can be increased. This can solve the problem that the radiation sensitivity of a photo IC is about 80% of that of a photodiode.

In this embodiment, the protective resins 42a and 42b are fixed to the multilayered substrate 44 having an internal conduction line while covering the metal wires 36a and 36b, but they can be fixed to the multilayered substrate 44 having an internal conduction line while covering the light-receiving cells 41a and 41b on the side of the light-receiving surface as well as the metal wires 36a and 36b. In this configuration, not only the metal wires 36a and 36b, which are the most susceptible to damage, but also the light-receiving surface of the light-receiving cells 41a and 41b can be protected from external damage, so that the halved light-receiving device 43 incorporating an electric circuit, which is a light-receiving device, can be handled more easily.

In this embodiment, in the flexible wiring board 48, only the peripheral portion of the halved light-receiving device 43 incorporating an electric circuit, which is a light-receiving device, is shown for example, but the flexible wiring board 48 can be a part of a head flexible wiring board for electrical connection of a light source or means for driving a light focusing element. More specifically, the flexible wiring board 48 is a part of a head flexible wiring board (not shown) for electrical wiring between a semiconductor laser 21, an objective lens actuator 23 and the light-receiving device 25 of the optical head 26 of FIG. 3 and an external circuit, and is not a component dedicated to the halved light-receiving device 43 incorporating an electric circuit, which is a light-receiving device. Therefore, an even more compact and simplified optical head can be achieved.

This is because a method for connecting electrically the head flexible wiring board and the components or a method for arranging the head flexible wiring board itself in the optical head (method for routing conduction lines) can be simplified. In this case, the light source may be a light-emitting chip element, and the light-emitting chip element may be connected electrically to the head flexible wiring board by attaching directly or via a metal wire. In other words, the light source is not the semiconductor laser 21 that is packaged with a diameter of 5.6 mm as shown in FIG. 2A, but a semiconductor chip that emits light and has a size of less than 1 mm$^3$ as shown in FIG. 4 referred to in Embodiment 1 is connected electrically to the head flexible wiring board, so that a compact optical head and a simplified head flexible wiring board can be achieved.

Furthermore, the light source may be a light-emitting chip element, and the light-emitting chip element may be connected electrically to a multilayered substrate with an internal conduction line that is the same as or different from the multilayered substrate 44 with an internal conduction line on which a light-receiving device is configured, by attaching directly or via a metal wire. For example, when the light source is not the semiconductor laser 21 that is packaged with a diameter of 5.6 mm as shown in FIG. 2A, but a semiconductor chip that emits light and has a size of less than 1 mm$^3$ is connected electrically to the multilayered substrate 44 having an internal conduction line, then the light source and the light-receiving device are configured integrally as one unit as a so-called light-receiving and emitting element, so that an even more compact optical head can be achieved.

In this embodiment, the halved light-receiving device 43 incorporating an electric circuit is configured so as to have the light-receiving cells 41a and 41b and the circuit portion 46, but as expressed that a light-receiving chip is constituted by the light-receiving cells 41a and 41b and the circuit portion 46, the halved light-receiving device 43 incorporating an electric circuit may be a halved photodiode that is a light-receiving device having only the light-receiving cells 41a and 41b without the circuit portion 46.

In this embodiment, the case where the halved light-receiving device 43 is a RF signal detecting element for detecting information signals of an information recording medium or a servo signal detecting element for detecting servo signals from an information recording medium has been described for example. However, the halved light-receiving device 43 may be any light-receiving device that can be used in an optical head, such as a sensor used to detect a tilt of an information recording medium or a tilt of means for driving a focusing element, or to confirm the light amount emitted from a light source. In this case as well, the height of the optical head is not increased.

In this embodiment, as shown in FIG. 5A, the light-receiving chip mounting portion of the light-receiving device 43 of the multilayered substrate 44 with an internal conduction line is configured to have a size of 2.5 mm, which is about the same size as the length of the longitudinal side of the light-receiving chips 31a and 31b, which is 1.5 mm, as opposed to the conventional example shown in FIG. 9A. Thus, similarly to Embodiment 1 described with reference to FIG. 2A, the size limit in the height direction of the optical head is not determined by the detecting portion.

Furthermore, in this embodiment, as shown in FIG. 5A, the mounting portion for the light-receiving device 43 of the head flexible wiring board 48 has three parallel conduction lines 39, and the light-receiving cells 41a and 41b are mounted on the multilayered substrate 44 with an internal conduction line such that the major division line 38 is substantially parallel to these conduction lines 39. In addition, the light-receiving cells 41a and 41b are mounted substantially in the center of the multilayered substrate 44 with an internal conduction line. This configuration can make more pronounced the advantage that the size limit in the height direction of the optical head is not determined by the detecting portion, similarly to Embodiment 1 described with reference to FIG. 2A.

As described above, by developing the configuration of this embodiment shown in FIGS. 5A and 5B, not only is it possible to reduce the size of only the peripheral portion of the halved light-receiving device 43, which is a light-receiving device, but also a new optical head in which a head flexible wiring board for electrical connection of each component such as a light source or a light-receiving device is incorporated and fixed can be configured.

As described above, first, the present invention can realize a light-receiving device that is more compact and thinner than conventional examples in a simple configuration without increasing the number of the components, secondly can achieve a compact flexible wiring board or multilayered substrate with an internal conduction line on which a light-receiving device is configured, and thirdly can realize a new optical head in which a head flexible wiring board for electrical connection of each component such as a light source or a light-receiving device is incorporated and fixed. Thus, as a whole, a compact optical head can be achieved.

The invention claimed is:

1. An optical head comprising a light source, means for driving a focusing element, and a light-receiving device for receiving light reflected from an information recording medium,
wherein the light-receiving device comprises a light-receiving chip having a plurality of electrodes, and a flexible wiring board on which the light-receiving chip is mounted and fixed,
the plurality of electrodes are connected electrically to the flexible wiring board by attaching directly or via a metal wire,
the light-receiving chip of the light-receiving device comprises a light-receiving cell on which light is incident and a circuit portion for amplifying and processing a photoelectric current from the light-receiving cell, and
the light-receiving cell and the circuit portion are provided independently from each other on a front face and a back face of the flexible wiring board.

2. The optical head according to claim 1, wherein the light-receiving device is configured such that a protective resin for preventing damage is fixed to the flexible wiring board while covering only the metal wire or both the metal wire and the light-receiving chip.

3. The optical head according to claim 1, wherein the flexible wiring board is a part of a head flexible wiring board for connecting electrically between the light source and the means for driving a focusing element, and an external circuit.

4. The optical head according to claim 3, wherein the light source is a light-emitting chip element, and the light-emitting chip element is connected electrically to the flexible wiring board by attaching directly or via a metal wire.

5. The optical head according to claim 1, wherein the light-receiving device is a RF signal light-receiving device for detecting an information signal of the information recording medium or a servo signal light-receiving device for detecting a servo signal from the information recording medium.

6. The optical head according to claim 1, wherein the light-receiving device is a sensor used to detect a tilt of the information recording medium or a tilt of the means for driving a focusing element, or to confirm a light amount emitted from the light source.

7. The optical head according to claim 1, wherein a light-receiving chip mounting portion of the flexible wiring board has a plurality of parallel conduction lines, and the light-receiving chip is mounted on the flexible wiring board such that a major division line is substantially parallel to the plurality of conduction lines.

8. The optical head according to claim 7, wherein the light-receiving chip is mounted substantially in the center of the light-receiving chip mounting portion of the flexible wiring board.

9. An optical head comprising a light source, means for driving a focusing element, and a light-receiving device for receiving light reflected from an information recording medium,
wherein the light-receiving device comprises a light-receiving chip having a plurality of electrodes, and a multilayered substrate with an internal conduction line on which the light-receiving chip is mounted and fixed, and
the plurality of electrodes are connected electrically to the multilayered substrate with an internal conduction line by attaching directly or via a metal wire.

10. The optical head according to claim 9, wherein the light-receiving device is configured such that a protective resin for preventing damage is fixed to the multilayered substrate with an internal conduction line while covering only the metal wire or both the metal wire and the light-receiving chip.

11. The optical head according to claim 9, wherein the multilayered substrate with an internal conduction line is connected electrically to a head flexible wiring board for connecting electrically between the light source and the means for driving a focusing element, and an external circuit.

12. The optical head according to claim 11, wherein the light source is a light-emitting chip element, and the light-emitting chip element is connected electrically to the head flexible wiring board by attaching directly or via a metal wire.

13. The optical head according to claim 11, wherein the light source is a light-emitting chip element, and the light-emitting chip element is connected electrically to a multilayered substrate with an internal conduction line that is the same as or different from the multilayered substrate with an internal conduction line, by attaching directly or via a metal wire.

14. The optical head according to claim 11, wherein a light-receiving chip mounting portion of the head flexible wiring board has a plurality of parallel conduction lines, and the light-receiving chip mounted and fixed onto the multilayered substrate with an internal. conduction line is mounted on the head flexible wiring board such that a major division line is substantially parallel to the plurality of conduction lines.

15. The optical head according to claim 14, wherein the multilayered substrate with an internal conduction line is mounted substantially in the center of the light-receiving chip mounting portion of the head flexible wiring board.

16. The optical head according to claim 9, wherein the light-receiving chip of the light-receiving device comprises a light-receiving cell on which light is incident and a circuit portion for amplifying and processing a photoelectric current from the light-receiving cell.

17. The optical head according to claim 16, wherein the light-receiving cell and the circuit portion are provided independently from each other on a front face and a back face of the multilayered substrate with an internal conduction line.

18. The optical head according to claim 9, wherein the light-receiving device is a RF signal light-receiving device for detecting an information signal of the information recording medium or a servo signal light-receiving device for detecting a servo signal from the information recording medium.

19. The optical head according to claim 9, wherein the light-receiving device is a sensor used to detect a tilt of the information recording medium or a tilt of the means for driving a focusing element, or to confirm a light amount emitted from the light source.

* * * * *

UNITED STATES PATENT AND TRADEMARK OFFICE
CERTIFICATE OF CORRECTION

PATENT NO. : 7,158,469 B1 Page 1 of 1
APPLICATION NO. : 10/502662
DATED : January 2, 2007
INVENTOR(S) : Aikoh et al.

It is certified that error appears in the above-identified patent and that said Letters Patent is hereby corrected as shown below:

Column 16, line 32(claim 14): "internal. conduction" should read --internal conduction--.

Signed and Sealed this

Twenty-sixth Day of June, 2007

JON W. DUDAS
*Director of the United States Patent and Trademark Office*